United States Patent
Huang et al.

(10) Patent No.: US 9,489,989 B2
(45) Date of Patent: Nov. 8, 2016

(54) VOLTAGE REGULATORS, MEMORY CIRCUITS, AND OPERATING METHODS THEREOF

(75) Inventors: Ming-Chieh Huang, San Jose, CA (US); Chan-Hong Chern, Palo Alto, CA (US); Tien Chun Yang, San Jose, CA (US); Chih-Chang Lin, San Jose, CA (US); Yuwen Swei, Fremont, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 315 days.

(21) Appl. No.: 12/820,712

(22) Filed: Jun. 22, 2010

(65) Prior Publication Data

US 2011/0310690 A1   Dec. 22, 2011

(51) Int. Cl.
| | |
|---|---|
| G11C 11/22 | (2006.01) |
| G11C 11/24 | (2006.01) |
| G11C 7/06 | (2006.01) |
| G11C 5/14 | (2006.01) |
| G11C 8/00 | (2006.01) |

(52) U.S. Cl.
CPC ..................................... *G11C 5/147* (2013.01)

(58) Field of Classification Search
USPC .................. 365/149, 189.09, 205, 207, 208, 365/230.03, 154, 203, 145, 226–229, 365/230.06, 189.07; 326/37–39, 95; 327/534, 544, 543; 257/357; 438/275; 323/280, 316
See application file for complete search history.

(56) References Cited

U.S. PATENT DOCUMENTS

| | | | | |
|---|---|---|---|---|
| 5,412,309 | A  * | 5/1995 | Ueunten | 323/316 |
| 5,900,665 | A  * | 5/1999 | Tobita | 257/357 |
| 6,057,676 | A | 5/2000 | Lee et al. | |
| 6,333,623 | B1 * | 12/2001 | Heisley et al. | 323/280 |
| 6,351,426 | B1 | 2/2002 | Ohsawa | |
| 6,436,771 | B1 * | 8/2002 | Jang et al. | 438/275 |
| 6,593,799 | B2 * | 7/2003 | De et al. | 327/534 |
| 7,256,644 | B2 * | 8/2007 | Ooishi et al. | 327/544 |
| 7,292,494 | B2 * | 11/2007 | Hsu et al. | 365/226 |
| 7,375,999 | B2 * | 5/2008 | Vogelsang | 365/149 |
| 7,403,444 | B2 * | 7/2008 | Fujiwara | 365/230.06 |
| 7,450,452 | B2 * | 11/2008 | Rosal et al. | 365/154 |
| 7,551,474 | B2 * | 6/2009 | Kim | 365/149 |
| 7,573,775 | B2 * | 8/2009 | Fallah et al. | 365/227 |
| 7,579,821 | B2 * | 8/2009 | Lee et al. | 365/203 |
| 7,733,682 | B2 * | 6/2010 | Madan | 365/145 |
| 7,764,087 | B2 * | 7/2010 | Kursun et al. | 326/95 |
| 7,768,299 | B2 * | 8/2010 | Gupta et al. | 326/38 |
| 7,977,932 | B2 * | 7/2011 | Morishita | 327/543 |
| 8,089,801 | B2 * | 1/2012 | Wang et al. | 365/149 |
| 2006/0290336 | A1 * | 12/2006 | Bazes | |

* cited by examiner

*Primary Examiner* — Trong Phan
(74) *Attorney, Agent, or Firm* — Lowe Hauptman & Ham, LLP

(57) ABSTRACT

A voltage regulator includes an output stage electrically coupled with an output end of the voltage regulator. The output stage includes at least one transistor having a bulk and a drain. At least one back-bias circuit is electrically coupled with the bulk of the at least one transistor. The at least one back-bias circuit is configured to provide a bulk voltage, such that the bulk and the drain of the at least one transistor are reverse biased during a standby mode of a memory array that is electrically coupled with the voltage regulator.

20 Claims, 6 Drawing Sheets

US 9,489,989 B2

VOLTAGE REGULATORS, MEMORY CIRCUITS, AND OPERATING METHODS THEREOF

TECHNICAL FIELD

The present disclosure relates generally to the field of semiconductor circuits, and more particularly, to voltage regulators, memory circuits, and operating methods thereof.

BACKGROUND

Memory circuits have been used in various applications. Memory circuits can include dynamic random access memory (DRAM) circuits, static random access memory (SRAM) circuits, and non-volatile memory circuits. A DRAM circuit has a plurality of memory cells. For a DRAM circuit in which arrays of capacitive storage memory cells are provided, each memory cell has an access transistor. Data stored in each memory cell is actually a charge stored on a small capacitor. When the data is to be output, the access transistor is activated by a word line (WL) coupled to the gate or control terminal of the transistor. The access transistor can couple the capacitor to a bit line (BL) coupled to a sense amplifier for sensing the voltage of the capacitor.

BRIEF DESCRIPTION OF THE DRAWINGS

The present disclosure is best understood from the following detailed description when read with the accompanying figures. It is emphasized that various features are not drawn to scale and are used for illustration purposes only. In fact, the numbers and dimensions of the various features may be arbitrarily increased or reduced for clarity of discussion.

DETAILED DESCRIPTION

Figure 1:
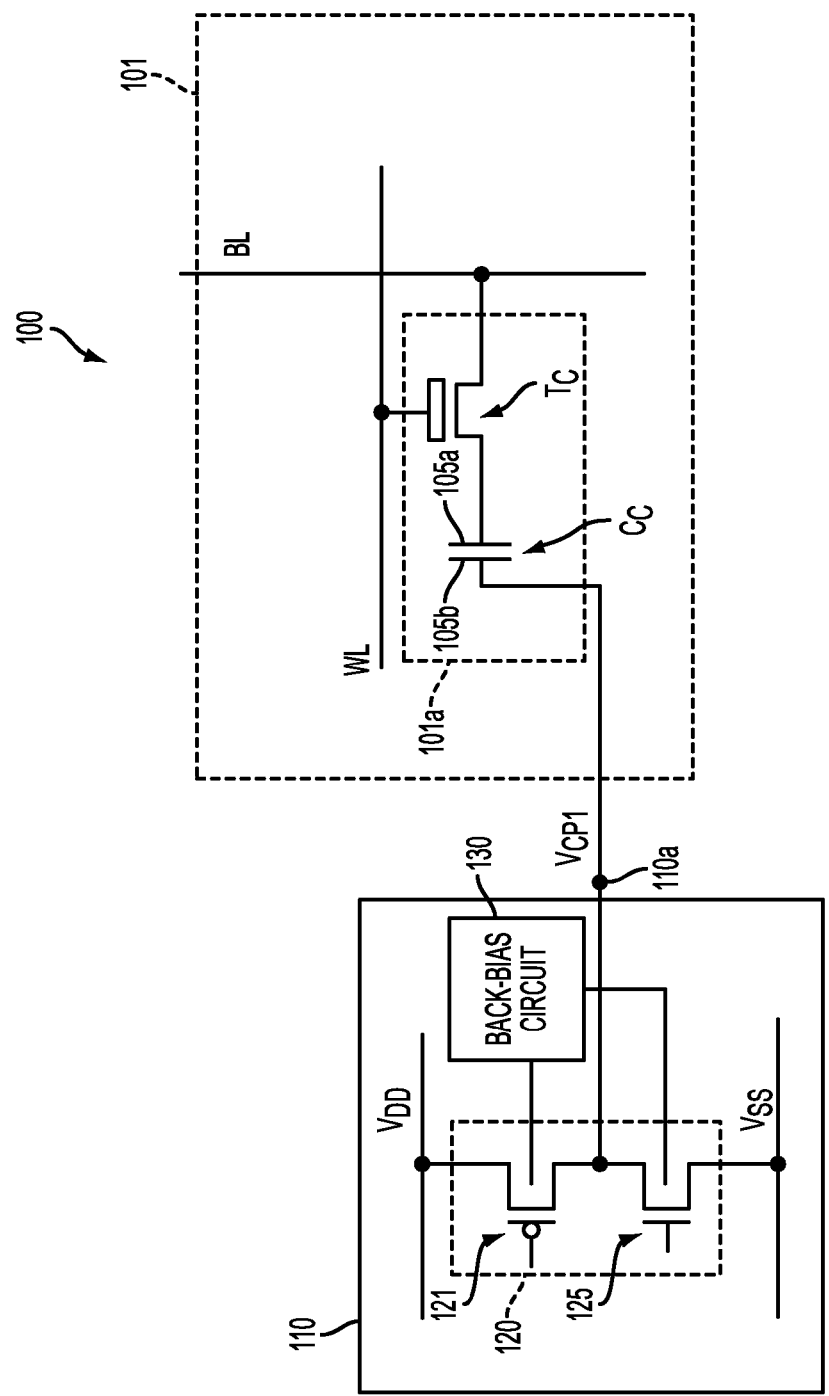
FIG. 1 is a schematic drawing illustrating an exemplary memory macro including a memory array electrically coupled with a voltage regulator.

A memory circuit has a plurality of memory macros. The memory macros each have a voltage regulator that is electrically coupled to each other. Each voltage regulator provides a common plate voltage to the corresponding memory array. Ideally, the voltage regulators provide the same common plate voltage for data storages.

Due to a process variation, the common plate voltages provided by the voltage regulators are different. The common plate voltage mismatch results in a current contention among the voltage regulators. During the standby mode of the memory macros, the current contention still exists among the voltage regulators. The current contention wastes the power of the memory circuit during the standby mode.

It is understood that the following disclosure provides many different embodiments or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic drawing illustrating an exemplary memory macro including a memory array electrically coupled with a voltage regulator. In FIG. 1, a memory macro 100 can include a memory array 101 that is electrically coupled with a voltage regulator 110. In some embodiments, the memory macro 100 can include an address decoder for selecting a memory cell according to an address signal, a sense amplifier for amplifying data read out of each memory cell, a write driver for writing data into each memory cell, and/or one or more other memory circuit components. In other embodiments, the memory macro 100 can be a dynamic random access memory (DRAM) macro, an embedded DRAM (eDRAM) macro, or any suitable memory macro that includes cell capacitors for storing data.

Referring to FIG. 1, the memory array 101 can include a plurality of word lines and a plurality of bit lines. In some embodiments, a memory cell 101a of the memory array 101 can be electrically coupled with a bit line (BL) and a word line (WL) of the memory array 101. The memory cell 101a can include a cell transistor ($T_C$) and a cell capacitor ($C_C$). The cell capacitor $C_C$ is configured for storing a charge representative of a datum, e.g., "0" or "1". The cell capacitor $C_C$ can include capacitor plates 105a and 105b. The capacitor plate 105a can be electrically coupled with the cell transistor $T_C$. The capacitor plate 105b can be electrically coupled with the voltage regulator 110. In some embodiments, the capacitor plate 105b can be referred to as a common plate. The capacitor plate 105b can be electrically coupled with capacitor plates of other memory cells in the memory array 101.

It is noted that though only one memory cell 101a is depicted, another cell (not shown) can be placed at each intersection of the word lines and the bit lines. A portion of a memory array 101 may have 8, 16, 32, 64, 128 or more columns that can be arranged in word widths. In some embodiments, the word lines can be laid out substantially orthogonally to the bit lines. In other embodiments, other arrangements of the word lines and bit lines can be provided.

Referring to FIG. 1, the voltage regulator 110 can be configured to provide a common plate voltage $V_{CP1}$ to the capacitor plate 105b of each memory cell 101a of the memory array 101. In some embodiments, the voltage regulator 110 can include an output stage 120 that is electrically coupled with an output end 110a of the voltage regulator 110. The output stage 120 can include at least one transistor, e.g., a P-type metal-oxide-semiconductor (PMOS) transistor 121 and an N-type metal-oxide-semiconductor (NMOS) transistor 125. The PMOS transistor 121 and the NMOS transistor 125 can each have a bulk and drain (not labeled).

The voltage regulator 110 can include a back-bias circuit 130. The back-bias circuit 130 can be electrically coupled with the bulks of the PMOS transistor 121 and the NMOS transistor 125. During a standby mode of the memory macro 100, the back-bias circuit 130 can be configured to provide bulk voltages to the bulks of the PMOS transistor 121 and the NMOS transistor 125, such that the bulk and the drain of each of the PMOS transistor 121 and the NMOS transistor 125 are reverse biased. In some embodiments, the term "standby mode of the memory macro 100" can mean that all memory cells of the memory array 101 are not accessed, e.g., no read and/or write operations. In some embodiments, each bulk of the PMOS transistor 121 and the NMOS transistor 125 can be referred to as an n-type well region, a p-type well region, an n-type deep well region, a p-type deep well region, an n-type shallow well region, a p-type shallow well region, an n-type buried layer, a p-type buried layer, or a semiconductor substrate.

Referring again to FIG. 1, the PMOS transistor 121 can be electrically coupled between the output end 110a of the voltage regulator 110 and a power line for providing a power voltage, e.g., power voltage $V_{DD}$. The NMOS transistor 125 can be electrically coupled between the output end 110a of the voltage regulator 110 and a power line for providing a power voltage, e.g., power voltage $V_{SS}$ or ground.

It is noted that the number and/or type of the transistors of the output stage 120 described above in conjunction with FIG. 1 are merely exemplary. In some embodiments, the output stage 120 can include a single transistor electrically coupled with a resistor. The output end 110a is between the single transistor and the resistor. The back-bias circuit 130 can provide a voltage to the bulk of the single transistor to reverse bias the bulk and drain of the single transistor. In other embodiments, the output stage 120 can include three or more transistors at least one of which can be reverse biased during the standby mode of the memory macro.

It is also noted that though only one back-bias circuit 130 is shown in FIG. 1 to control the bulk voltages of the transistors, the scope of this application is not limited thereto. In some embodiments, two or more back-bias circuits can be used to separately control the bulk voltages of the transistors.

Figure 2:
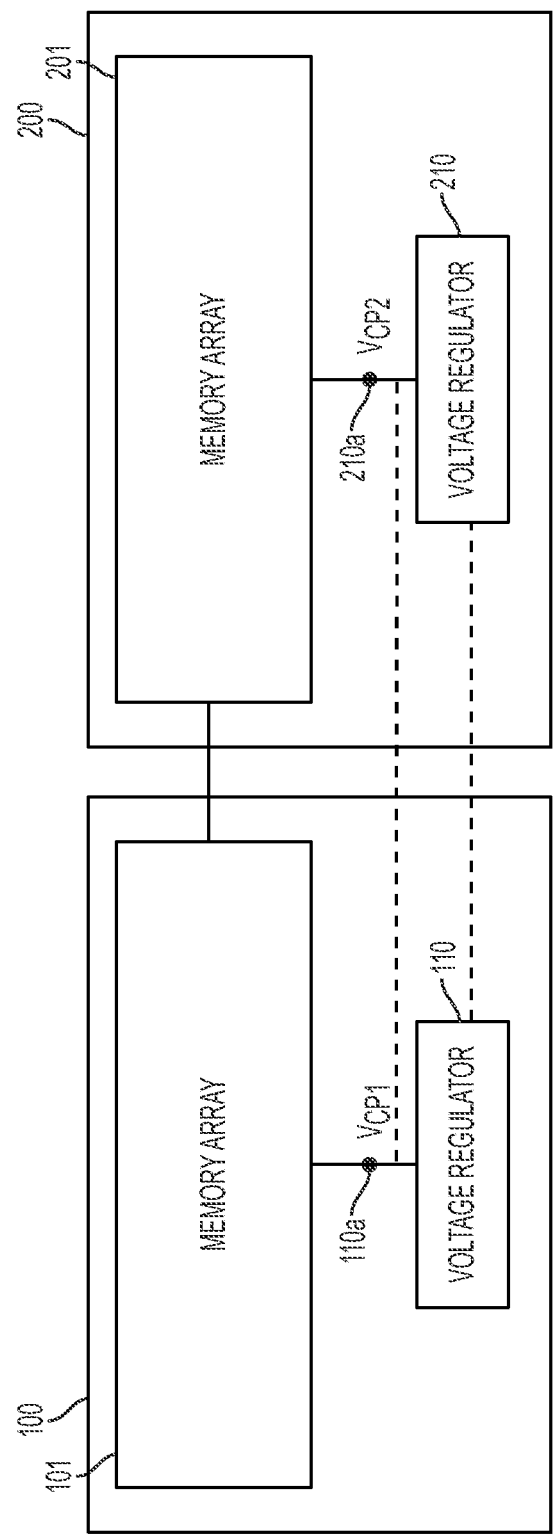
FIG. 2 is a schematic drawing illustrating an exemplary memory circuit including a plurality of memory macros.

In some embodiments, the memory macro 100 can be electrically coupled with another memory macro, e.g., memory macro 200, as shown in FIG. 2. The memory macro 200 can include a memory array 201 electrically coupled with a voltage regulator 201. Structures of the memory array 201 and the voltage regulator 210 can be similar to those of the memory array 101 and the voltage regulator 110, respectively. In FIG. 2, the memory array 101 can be electrically coupled with the memory array 201 through, for example, at least one word line routed therebetween. In some embodiments, the voltage regulator 110 can be electrically coupled with the voltage regulator 210 through at least one memory array, e.g., the memory arrays 101 and 201. In other embodiments, the voltage regulator 210 can be directly electrically coupled with the voltage regulator 110 through a conductive line. In still other embodiments, the output end 110a of the voltage regulator 110 can be electrically coupled with an output end 210a of the voltage regulator 210. Though only two memory macros are shown in FIG. 2, the scope of the application is not limited thereto. In some embodiments, the memory circuit can include three or more memory macros that are electrically coupled to each other.

In some embodiments, the memory macros 100 and 200 both are operated under the standby mode. As noted, the voltage regulator 110 can provide the common plate voltage $V_{CP1}$ to the common plate of each memory cell 101a of the memory array 101. Similarly, the voltage regulator 210 can provide another common plate voltage $V_{CP2}$ to the common plate of each memory cell of the memory array 201.

Ideally, the voltage regulators 110 and 210 can provide the same common plate voltage, e.g., about 0.45*$V_{DD}$, during their standby mode. Due to a process variation, however, the applicants find that a threshold voltage ($V_t$) mismatch of input transistor pair (not shown) of an operational amplifier 160 (shown in FIG. 3) of the voltage regulator 110 may occur. The threshold voltage mismatch can cause the difference between the common plate voltages $V_{CP1}$ and $V_{CP2}$. The common plate voltage mismatch results in a contention current flowing between the voltage regulators 110 and 210. If the memory macros 100 and 200 are both under the standby mode, and the bulks and the drains of the transistors of each output stage of the voltage regulators 110 and 210 were not reverse biased, the contention current will be high as shown below in the second column of Table 1. Due to the high contention current, the power consumption of the memory macros 100 and 200 during the standby mode is high, too.

As noted, the bulks and the drains of the transistors of each output stage of the voltage regulators 110 and 210 are reverse biased during their standby modes. Due to the reverse-biased transistors, the contention current between the voltage regulators 110 and 210 can thus be reduced as shown below in the third column of Table 1. As shown in Table 1, the contention current between the voltage regulators 110 and 210, in some embodiments, can be saved by as much as 76.5%.

TABLE 1

| $V_t$ mismatch (mV) of input pairs of operational amplifier | Not reverse biased Contention current (μA) | Reverse biased Contention current (μA) | Contention current reduction percentage (%) |
|---|---|---|---|
| 5 | 25.1 | 5.9 | 76.5 |
| 10 | 123.6 | 35.4 | 71.4 |
| 15 | 460.3 | 178.9 | 61.1 |
| 20 | 1123.6 | 597.1 | 46.9 |

It is noted that though the data shown in Table I is corresponding to the memory macros 100 and 200 both of which are under the standby mode. In some embodiments, the memory macro 100 can be operated under the standby mode and the memory macro 200 can be operated under the access mode. The contention current between the voltage regulators 110 and 210 is higher than the contention current in which the memory macros 100 and 200 both are operated under the standby mode as shown in Table 1.

Figure 3:
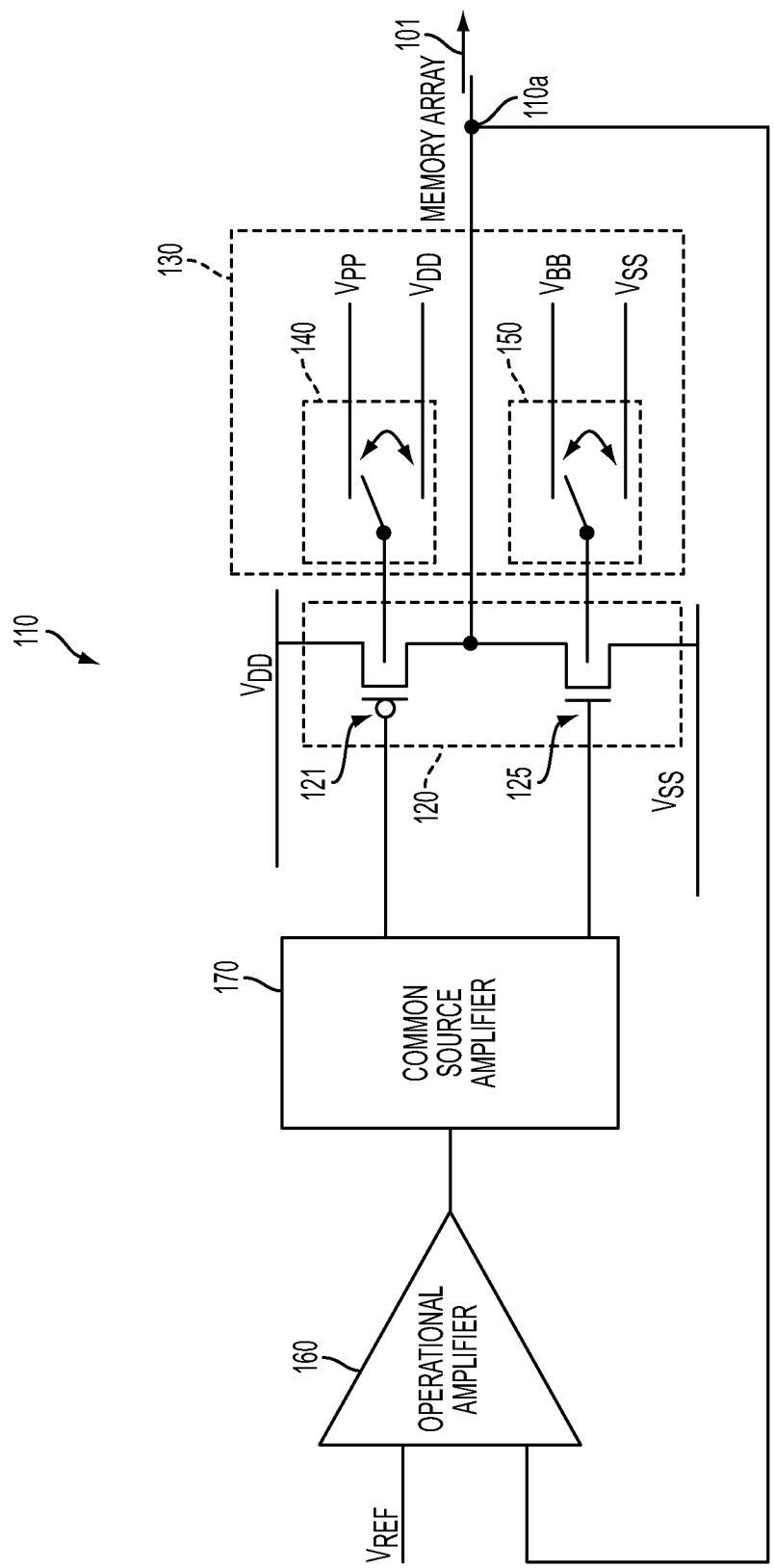
FIG. 3 is a schematic drawing illustrating an exemplary voltage regulator.

FIG. 3 is a schematic drawing illustrating an exemplary voltage regulator. In some embodiments, the voltage regulator 110 can include the operational amplifier 160 that can be electrically coupled with the output end 110a of the voltage regulator 110. As noted, the operational amplifier 160 can include an input transistor pair (not shown). One of the input transistor pair can receive a reference voltage $V_{ref}$. Another one can be electrically coupled with the output end 110a of the voltage regulator 110. The operational amplifier 160 can compare the reference voltage $V_{ref}$ and the voltage level on the output end 110a, outputting a signal to control the output stage 120. The output signal from the output of the operational amplifier 160 is received at the corresponding gates of the PMOS transistor 121 and the NMOS transistor 125.

In some embodiments, the voltage regulator 110 can optionally include a common source amplifier 170 that can be electrically coupled between the output stage 120 and the operational amplifier 160. The common source amplifier 170 can amplify the signal from the operational amplifier 160 for controlling the output stage 120. In other embodiments, one or more stages can be optionally disposed between the operational amplifier 160 and the common source amplifier 170 and/or between the common source amplifier 170 and the output stage 120.

Referring to FIG. 3, the back-bias circuit 130 can include at least one switching circuit, e.g., switching circuits 140 and 150. The switching circuit 140 can be electrically coupled between the bulk of the PMOS transistor 121 and a power line for providing a power voltage, e.g., power voltage $V_{PP}$. The switching circuit 150 can be electrically coupled between the bulk of the NMOS transistor 125 and a power line for providing a power voltage, e.g., power voltage $V_{BB}$.

In some embodiments, the switching circuit 140 can be electrically coupled with the power lines for providing power voltages $V_{PP}$ and $V_{DD}$. The switching circuit 150 can be electrically coupled with the power voltage $V_{BB}$ and $V_{SS}$. In some embodiments, the power voltage $V_{PP}$ is higher than the power voltage $V_{DD}$. For example, the power voltage $V_{PP}$ is substantially equal to $V_{PP}$+0.5 V. In other embodiments, the power voltage $V_{SS}$ is higher than the power voltage $V_{BB}$. For example, the power voltage $V_{BB}$ is substantially equal to $V_{SS}$−0.5 V.

During the access mode of the memory macro 100, the switching circuit 140 can electrically couple the power voltage $V_{DD}$ to the bulk of the PMOS transistor 121 and electrically isolate the bulk of the PMOS transistor 121 from the power voltage $V_{PP}$. Also, the switching circuit 150 can electrically couple the power voltage $V_{SS}$ to the bulk of the NMOS transistor 125 and electrically isolate the bulk of the NMOS transistor 125 from the power voltage $V_{BB}$. Since the drains of the PMOS transistor 121 and the NMOS transistor 125 are electrically coupled with the power voltages $V_{DD}$ and $V_{SS}$, respectively, the bulks and drains of the PMOS transistor 121 and the NMOS transistor 125 are not reverse biased.

If the memory macro 100 is switched from the access mode to the standby mode, the switching circuit 140 can switch the electrical coupling of the bulk of the PMOS transistor 121 from the power voltage $V_{DD}$ to the power voltage $V_{PP}$, such that the bulk and the drain of the PMOS transistor 121 are reverse biased. Also, the switching circuit 150 can switch the electrical coupling of the bulk of the NMOS transistor 125 from the power voltage $V_{SS}$ to the power voltage $V_{BB}$, such that the bulk and the drain of the NMOS transistor 125 are reverse biased.

Figure 4:
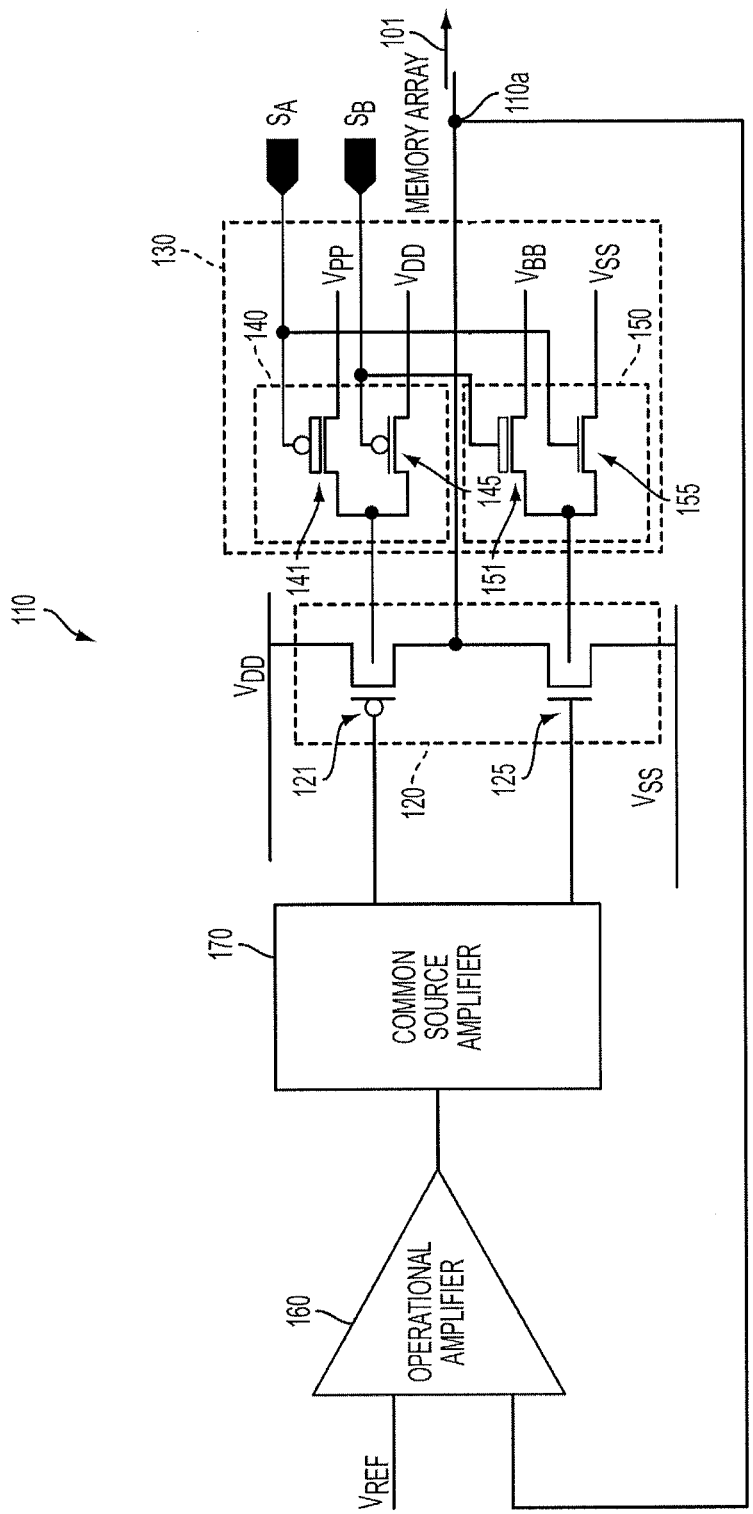
FIG. 4 is a schematic drawing illustrating another exemplary voltage regulator.

FIG. 4 is a schematic drawing illustrating another exemplary voltage regulator. In FIG. 4, in some embodiments the switching circuit 140 can comprise at least one transistor, e.g., PMOS transistors 141 and 145. The PMOS transistors 141 and 145 can be electrically coupled between the bulk of the PMOS transistor 121 and the power lines for providing the power voltage $V_{PP}$ and $V_{DD}$, respectively. The switching circuit 150 can comprise at least one transistor, e.g., NMOS transistors 151 and 155. The NMOS transistors 151 and 155 can be electrically coupled between the bulk of the NMOS transistor 125 and the power lines for providing the power voltage $V_{BB}$ and $V_{SS}$, respectively. In some embodiments, an effective gate dielectric thickness of the PMOS transistor 141 is larger than each effective gate dielectric thickness of the PMOS transistors 121 and 145. In other embodiments, an effective gate dielectric thickness of the NMOS transistor 151 is larger than each effective gate dielectric thickness of the NMOS transistors 125 and 155. In still other embodiments, the effective gate dielectric thickness of the PMOS transistor 141 is substantially equal to that of the NMOS transistor 151.

Referring to FIG. 4, the gate of the PMOS transistor 141 can be electrically coupled with the gate of the NMOS transistor 155. The gates of the PMOS transistor 141 and the NMOS transistor 155 can receive a signal $S_A$. The gate of the PMOS transistor 145 can be electrically coupled with the gate of the NMOS transistor 151. The gates of the PMOS transistor 145 and the NMOS transistor 151 can receive another signal $S_B$. In other embodiments, the gates of the PMOS transistor 141 and the NMOS transistor 155 are not coupled to each other and can separately receive the signal $S_A$. The gates of the PMOS transistor 145 and the NMOS transistor 151 are not coupled to each other and can separately receive the signal $S_B$.

During the access mode of the memory macro 100, the signal $S_A$ can have a high voltage state and the signal $S_B$ can have a low voltage state. The high voltage state signal $S_A$ turns off the PMOS transistor 141 and turns on the NMOS transistor 155. The turned-on NMOS transistor 155 can electrically couple the power voltage $V_{SS}$ to the bulk of the NMOS transistor 125. The low voltage state signal $S_B$ turns off the NMOS transistor 151 and turns on the PMOS transistor 145. The turned-on PMOS transistor 145 can electrically couple the power voltage $V_{DD}$ to the bulk of the PMOS transistor 121. Since the drains of the PMOS transistor 121 and the NMOS transistor 125 are electrically coupled with the power voltages $V_{DD}$ and $V_{SS}$, respectively, the bulks and drains of the PMOS transistor 121 and the NMOS transistor 125 are not reverse biased.

If the memory macro 100 is switched from the access mode to the standby mode, the signal $S_A$ can go low to a low voltage state and the signal $S_B$ can go high to a high voltage state. The low voltage state signal $S_A$ turns off the NMOS transistor 155 and turns on the PMOS transistor 141. The turned-on PMOS transistor 141 can electrically couple the power voltage $V_{PP}$ to the bulk of the PMOS transistor 121. The high voltage state signal $S_B$ turns off the PMOS transistor 145 and turns on the NMOS transistor 151. The turned-on NMOS transistor 151 can electrically couple the power voltage $V_{BB}$ to the bulk of the NMOS transistor 125. The bulk and drain of each of the PMOS transistor 121 and the NMOS transistor 125 are reverse biased.

It is noted that the back-bias circuit 130, the switching circuits 140 and 150, and the transistors described above in conjunction with FIGS. 3 and 4 are merely exemplary. In some embodiments, the back-bias circuit 130 can include a voltage divider, a plurality of series diodes, a plurality of series resistors, at least one switch, a multiplexer, at least one power source, one or more components that are suitable to be assembled to form the back-bias circuit 130, or any combinations thereof. In other embodiments, the back-bias circuit 130 can be any circuit that can be configured to adjust the voltages on the bulks of the PMOS transistor 121 and the NMOS transistor 125.

Figure 5:
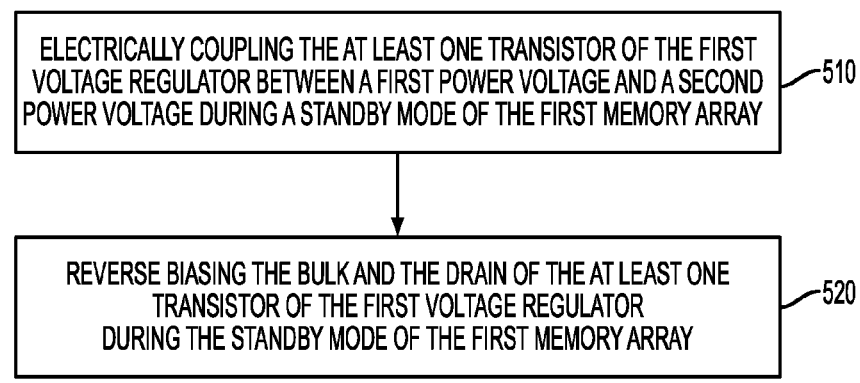
FIG. 5 is a schematic flow illustrating an exemplary method of operating a memory circuit during a data retention mode.

FIG. 5 is a flowchart illustrating an exemplary method of operating a memory circuit. Referring to FIGS. 1, 2, and 5, in step 510 the at least one transistor, e.g., the PMOS transistor 121 and the NMOS transistor 125, of the output stage 120 of the voltage regulator can be electrically coupled between the power voltages $V_{DD}$ and $V_{SS}$ during the standby mode of the memory array 101. In step 520, the bulk and the drain of the at least one transistor of the voltage regulator 110 can be reverse biased during the standby mode of the first memory array. In some embodiments, the step 510 can be performed prior to the step 520. In other embodiments, the steps 510 and 520 can be performed simultaneously. In still other embodiments, the method of operating the memory circuit can include the operations of the memory macros, memory arrays, voltage regulators, back-bias circuits, switching circuits, and/or transistors described above in conjunction with FIGS. 1-4.

Figure 6:
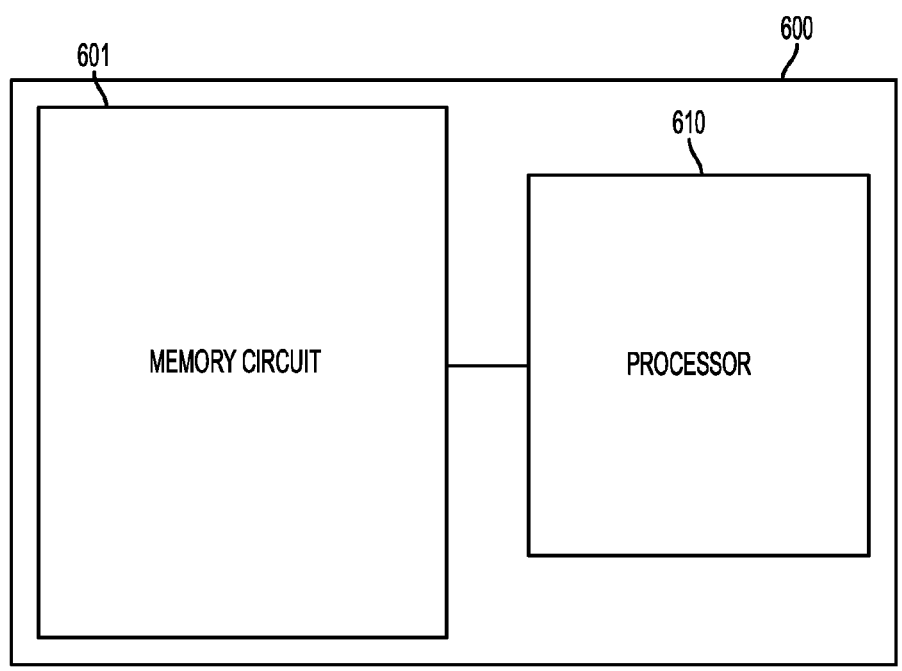
FIG. 6 is a schematic drawing showing a system including an exemplary memory circuit.

FIG. 6 is a schematic drawing showing a system including an exemplary memory circuit. In FIG. 6, a system 600 can include a processor 610 coupled with a memory circuit 601. The memory circuit 601 can be similar to the memory circuit described above in conjunction with FIG. 2. The processor 610 can be a processing unit, central processing unit, digital signal processor, or other processor that is suitable for accessing data of memory circuit.

In some embodiments, the processor 610 and the memory circuit 601 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system 600 including the memory circuit 601 can provide an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A voltage regulator comprising:
   an amplifier configured to output a control signal based on a comparison between a reference voltage and an output voltage;
   an output end electrically coupled to a first memory array, the output end being configured to provide the output voltage to the first memory array;
   a feedback loop coupling the output end to the amplifier, the output voltage being provided to the amplifier by way of the feedback loop;
   an output stage electrically coupled between the amplifier and the output end, the output stage comprising at least one transistor having a bulk and a drain; and
   at least one back-bias circuit electrically coupled with the bulk of the at least one transistor, the at least one back-bias circuit being configured to provide a bulk voltage such that the bulk and the drain of the at least one transistor are reverse biased during a standby mode of the first memory array,
   wherein the first memory array is coupled to a second memory array by a word line, the second memory array is coupled to a corresponding voltage regulator through a corresponding output end of the corresponding voltage regulator, the voltage regulator is directly electrically coupled with the corresponding voltage regulator, a contention current flows between the voltage regulator and the corresponding voltage regulator, and the back-bias circuit is configured to reduce the contention current during the standby mode by way of the reverse biasing.

2. The voltage regulator of claim 1, wherein the at least one transistor comprises:
   a first P-type metal-oxide-semiconductor (PMOS) transistor, the first PMOS transistor being electrically coupled between the output end of the voltage regulator and a first power line for providing a first power voltage; and
   a first N-type metal-oxide-semiconductor (NMOS) transistor, the first NMOS transistor being electrically coupled between the output end of the voltage regulator and a second power line for providing a second power voltage.

3. The voltage regulator of claim 2, wherein the at least one back-bias circuit comprises:
   a first switching circuit electrically coupled with a third power line for providing a third power voltage, wherein the first switching circuit is configured to electrically couple the bulk of the first PMOS transistor with the third power line during the standby mode; and
   a second switching circuit electrically coupled with a fourth power line for providing a fourth power voltage, wherein the second switching circuit is configured to electrically couple the bulk of the first NMOS transistor with the fourth power line during the standby mode.

4. The voltage regulator of claim 3, wherein
   the first switching circuit comprises:
      a second PMOS transistor, the second PMOS transistor being electrically coupled between the third power line and the bulk of the first PMOS transistor; and
      a third PMOS transistor, the third PMOS transistor being electrically being coupled between the bulk of the first PMOS transistor and a fifth power line for providing the first power voltage, and
   the second switching circuit comprises:
      a second NMOS transistor, the second NMOS transistor being electrically coupled between the fourth power line and the bulk of the first NMOS transistor; and
      a third NMOS transistor, the third NMOS transistor being electrically being coupled between the bulk of the first NMOS transistor and a sixth power line for providing the second power voltage.

5. The voltage regulator of claim 4, wherein an effective gate dielectric thickness of the second PMOS transistor is larger than each effective gate dielectric thickness of the first and third PMOS transistors, and an effective gate dielectric thickness of the second NMOS transistor is larger than each effective gate dielectric thickness of each of the first and third NMOS transistors.

6. The voltage regulator of claim 4, wherein the third power voltage is higher than the first power voltage, and the second power voltage is higher than the fourth power voltage.

7. The voltage regulator of claim 1, further comprising:
a common source amplifier, wherein the common source amplifier is electrically coupled between the amplifier and the output stage.

8. A memory circuit, comprising:
a first memory array having a plurality of first memory cells, the first memory cells each having a first cell capacitor;
a first voltage regulator electrically coupled with a first common plate of each first cell capacitor, the first voltage regulator including
  a first amplifier configured to output a first control signal based on a comparison between a first reference voltage and a first output voltage;
  a first output end electrically coupled to the first memory array, the first output end being configured to provide the first output voltage to the first memory array;
  a first feedback loop coupling the first output end to the first amplifier, the first output voltage being provided to the first amplifier by way of the first feedback loop;
  a first output stage electrically coupled between the first amplifier and the first output end of the first voltage regulator, the first output stage comprising at least one first transistor having a bulk and a drain; and
  at least one first back-bias circuit electrically coupled with the bulk of the at least one first transistor, the first back-bias circuit being configured to provide a bulk voltage such that the bulk and the drain of the at least one first transistor are reverse biased during a standby mode of the first memory array;
a second memory array having a plurality of second memory cells, the second memory cells each having a second cell capacitor; and
a second voltage regulator electrically coupled with a second common plate of each second cell capacitor, the second voltage regulator being configured to provide a second output voltage to the second memory array,
wherein the second voltage regulator is electrically coupled with the first voltage regulator by a conductive line, a contention current flows between the first voltage regulator and the second voltage regulator, and the back-bias circuit is configured to reduce the contention current by way of the reverse biasing during the standby mode.

9. The memory circuit of claim 8, wherein the second voltage regulator comprises at least one second transistor having a bulk and a drain, and during a standby mode of the second memory array, the bulk and the drain of the at least one second transistor are reverse biased.

10. The memory circuit of claim 9, wherein the second voltage regulator comprises at least one second back-bias circuit that is electrically coupled with the bulk of the at least one second transistor, and the at least one second back-bias circuit is configured to reverse bias the bulk and the drain of the at least one second transistor.

11. The memory circuit of claim 9, wherein the at least one first transistor comprises:
a first P-type metal-oxide-semiconductor (PMOS) transistor, the first PMOS transistor being electrically coupled between an output end of the first voltage regulator and a first power line for providing a first power voltage; and
a first N-type metal-oxide-semiconductor (NMOS) transistor, the first NMOS transistor being electrically coupled between the output end of the first voltage regulator and a second power line for providing a second power voltage.

12. The memory circuit of claim 11, wherein the at least one back-bias circuit comprises:
a first switching circuit electrically coupled with a third power line for providing a third power voltage, wherein the first switching circuit is configured to electrically couple the bulk of the first PMOS transistor with the third power line during the standby mode of the first memory array; and
a second switching circuit electrically coupled with a fourth power line for providing a fourth power voltage, wherein the second switching circuit is configured to electrically couple the bulk of the first NMOS transistor with the fourth power line during the standby mode of the first memory array.

13. The memory circuit of claim 12, wherein
the first switching circuit comprises:
  a second PMOS transistor, the second PMOS transistor being electrically coupled between the third power line and the bulk of the first PMOS transistor; and
  a third PMOS transistor, the third PMOS transistor being electrically being coupled between the bulk of the first PMOS transistor and a fifth power line for providing the first power voltage, and
the second switching circuit comprises:
  a second NMOS transistor, the second NMOS transistor being electrically coupled between the fourth power line and the bulk of the first NMOS transistor; and
  a third NMOS transistor, the third NMOS transistor being electrically being coupled between the bulk of the first NMOS transistor and a sixth power line for providing the second power voltage.

14. The memory circuit of claim 13, wherein an effective gate dielectric thickness of the second PMOS transistor is larger than each effective gate dielectric thickness of the first and third PMOS transistors, and an effective gate dielectric thickness of the second NMOS transistor is larger than each effective gate dielectric thickness of each of the first and third NMOS transistors.

15. The memory circuit of claim 13, wherein the third power voltage is higher than the first power voltage, and the second power voltage is higher than the fourth power voltage.

16. The memory circuit of claim 8, wherein the first voltage regulator further comprises:
a common source amplifier, wherein the common source amplifier is electrically coupled between the amplifier and the first output stage.

17. A method of operating a memory circuit, the memory circuit comprising a first memory array and a second memory array each comprising a plurality of memory cells, the first and second memory arrays each being electrically coupled with a first and a second voltage regulator, respectively, the first and second voltage regulators being electrically coupled to each other, the first and second voltage regulator each having an output stage, each output stage comprising at least one transistor having a bulk and a drain, the method comprising:
electrically coupling the at least one transistor of the first voltage regulator between a first power voltage and a second power voltage during a standby mode of the first memory array;
receiving via an amplifier, a reference voltage and an output voltage provided by an output end of the first voltage regulator to the first memory array via a feedback loop electrically coupling the output end and the amplifier;

comparing the reference voltage and the output voltage;
outputting a control signal based on the comparison; and
reverse biasing the bulk and the drain of the at least one transistor of the first voltage regulator by at least one first back-bias circuit during the standby mode of the first memory array,
wherein the first voltage regulator is coupled to the second voltage regulator via a conductive line, a contention current flows between the first voltage regulator and the second voltage regulator, and the back-bias circuit is configured to reduce the contention current by way of the reverse biasing during the standby mode.

18. The method of claim 17, further comprising:
electrically coupling the at least one transistor of the second voltage regulator between the first power voltage and the second power voltage during a standby mode of the second memory array; and
reverse biasing the bulk and the drain of the at least one transistor of the second voltage regulator during the standby mode of the second memory array.

19. The method of claim 17, wherein reverse biasing the bulk and the drain of the at least one transistor of the first voltage regulator comprises:
electrically coupling the bulk of a first PMOS transistor of the at least one transistor with a third power voltage that is higher than the first power voltage during the standby mode of the first memory array; and
electrically coupling the bulk of a first NMOS transistor of the at least one transistor with a fourth power voltage that is lower than the second power voltage during the standby mode of the first memory array.

20. The method of claim 17, further comprising amplifying the control signal output by the amplifier prior to controlling the output stage.

* * * * *